United States Patent [19]
Leung

[11] Patent Number: 5,696,708
[45] Date of Patent: Dec. 9, 1997

[54] DIGITAL FILTER WITH DECIMATED FREQUENCY RESPONSE

[75] Inventor: Ka Yin Leung, Austin, Tex.

[73] Assignee: Crystal Semiconductor, Austin, Tex.

[21] Appl. No.: 413,356

[22] Filed: Mar. 30, 1995

[51] Int. Cl.$^6$ .................................................. G06F 17/17
[52] U.S. Cl. .................................................. 364/724.1
[58] Field of Search .................... 364/724.1, 724.13, 364/724.01

[56] References Cited

U.S. PATENT DOCUMENTS

| | | | |
|---|---|---|---|
| 4,564,918 | 1/1986 | McNally et al. | 364/569 |
| 4,716,472 | 12/1987 | McNally | 360/8 |
| 4,748,578 | 5/1988 | Lagadec et al. | 364/724 |
| 4,772,871 | 9/1988 | Suzuki et al. | 341/155 |
| 4,780,892 | 10/1988 | Lagadec | 375/118 |
| 4,825,398 | 4/1989 | Koch et al. | 364/724.1 |
| 4,943,807 | 7/1990 | Early . | |
| 5,212,659 | 5/1993 | Scott et al. | 364/724.1 |
| 5,257,026 | 10/1993 | Thompson et al. . | |
| 5,506,798 | 4/1996 | Shimada et al. | 364/724.1 |

OTHER PUBLICATIONS

Robert Adams and Tom Kwan, "Theory and VLSI Architectures for Asynchronous Sample–Rate Converters," *J. Audio Eng. Soc.*, vol. 41, No. 7/8, Jul./Aug.

Robert Adams and Tom Kwan, "A Stereo Asynchronous Digital Sample–Rate Converter for Digital Audio," *IEEE Journal of Solid–State Circuits*, vol. 29, No. 4, Apr. 1994.

"Advance Information: DSP56ADC16 16–Bit Sigma–Delta Analog–to–Digital Converter," Motorola, Inc., 1989.

M. S. Ghausi and K. R. Laker, "Modern Filter Design," by Bell Telephone Laboratories, Inc., pp. 342–357, 1981.

R. W. Adams, P. F. Ferguson, Jr., A. Fanesan, S. Vincelette, A. Volpe, and R. Libert, "Theory and Practical Implementation of a Fifth–Order Sigma–Delta A/D Converter," *J. Audio Eng. Soc.*, vol. 39, Nos. 7–8, pp. 515–527, Jul./Aug. 1991.

S. A. Jantzi, W. M. Snelgrove, and P. F. Ferguson, Jr., "A Fourth–Order Bandpass Sigma–Delta Modulator," *IEEE Journal of Solid–State Circuits*, vol. 28, No. 3, pp. 282–291, Mar. 1993.

R. Gregorian and G. C. Temes, "Analog MOS Integrated Circuits for Signal Processing," *A Wiley–Interscience Publication*, John Wiley and Sons, pp. 265–401, 1986.

Lawrence R. Rabiner, Bernard Gold, "Theory and Application of Digital Signal Processing", pp. 328–329.

Charles D. Thompson, Salvador R. Bernadas, "A Digitally–Corrected 20b Delta–Sigma Modulator", 1994 IEEE International Solid–State Circuits Conference, pp. 194–195.

Y. Matsuya, K. Uchimura, A. Iwata, T. Kobayashi, "A 16–bit Oversampling A–to–D Conversion Technology Using Triple–Integration Noise Shaping", *IEEE Journal of Solid–State Cirucits*, vol. SC–22, Dec. 1987, pp. 921–928.

Mehdi Hatamiam and Keshab K. Parhi, "An 85–MHz Fourth–Order Programmable IIH Digital Filter Chip", *IEEE Journal of Solid–State Circuits*, vol. 27, No. 2, Feb. 1992, pp. 175–183.

(List continued on next page.)

*Primary Examiner*—Tan V. Mai
*Attorney, Agent, or Firm*—Gregory M. Howison; J. P. Violette

[57] ABSTRACT

A method for changing the frequency of a low-pass Finite Impulse Response (FIR) filter with a fixed frequency clock utilizes a decimation-by-coefficient technique. The decimation-by-coefficient method utilizes a single set of coefficients that are stored in a coefficient Read Only Memory (ROM) (64). Data is input to an elastic buffer (60) with multiplications performed by a multiplication circuit (62). To realize a low frequency filter, all coefficients are utilized in the multiplication operations with sequential multiplies. These are accumulated in register (70), this providing a high precision filter. To increase frequency by a factor of two—to decimate the coefficients by a factor of two, it is only necessary to utilize every other coefficient, such that only a single fixed clock (78) is required.

38 Claims, 4 Drawing Sheets

OTHER PUBLICATIONS

David Vallancourt and Yannis P. Tsividis "A Fully Programmable Sampled–Data Analog CMOS Filter with Transfer–Function Coefficients Determined by Timing", IEEE Journal of Solid–State Circuits, vol. SC–22, No. 6, Dec. 1987, pp. 1022–1030.

Kin Lin and John Poulos, "Area Efficient Decimation Filter for an 18–bit Delta–Sigma Analog–to–Digital Convert", AES Feb. 1995, pp. 1–10.

Alan V. Oppenheim and Alan S. Willsky, "Signals and Systems", Analysis and Characterization of LTI Systems Using z–Transforms, Sec. 10.7, 1983.

David Vallancourt and Yannis P. Tsividis, "Timing–Controlled Fully Programmable Analog Signal Processors Using Switched Continuous–Time Filters", IEEE Transactions on Circuits and Systems, vol. 35, No. 8, Aug. 1988, pp. 947–954.

1994 Crystal Semiconductor Audio Databook, pp. 3–143.

DSP56000/DSP56001 Digital Signal Processor User's Manual, Rev. 2, pp. 11-8–11-9, 1990.

Texas Instruments TMS320C3x User's Guide, 1992, pp. 8-12–8-16.

Andreas Antoniou, "Digital Filters", Second Edition, 1993, pp. 366–381.

DIGITAL FILTER WITH DECIMATED FREQUENCY RESPONSE

TECHNICAL FIELD OF THE INVENTION

The present invention pertains in general to digital filters and, more particularly, to a digital filter operating at selectable bandwidths in an analog-to-digital converter.

BACKGROUND OF THE INVENTION

Analog-to-Digital converters have recently seen an increased use with an oversampled architecture. Oversampled Analog-to-Digital conversion typically runs four, eight, or even one hundred twenty-eight times faster than the conventional single conversion cycle data convertors, requiring a corresponding higher number of samples to be generated for every output sample. Typically, in this type of architecture, digital decimation is utilized to provide this decrease in the input rate. In digital decimation, two distinct steps are utilized. The first step of decimation is to receive the input sequence x[n], with Fourier Transform X[f] at a sample rate of $f_s$. This input sequence x[n] is filtered to remove out-of-band noise. The second step is to downsample the high sample rate of $f_s$ to a lower sampling rate of $f_s/N$, where N is the decimation factor.

Typically, the analog signal is first processed by an analog modulator in the form of a delta-sigma analog modulator. This analog modulator operates over a baseband, but has significant quantization noise outside of the base band. The digital filter is utilized to filter out this quantization noise. The operation of the digital filter is described in U.S. Pat. No. 5,212,659, issued May 18, 1993, and assigned to the present assignee, which reference is incorporated herein by reference.

In some applications, the word rate that is output by the filter and the overall data converter is required to operate at different rates. As such, it is necessary for the filter to have two different bandwidths. For example, if a system required the word rate to operate at 48 KHz or 96 KHz, this would allow a baseband of 24 KHz and 48 KHz, respectively. This would then require the filter to operate such that the pass band of the filter corresponded to the baseband. One technique for accomplishing this is to basically change the clock frequency of both the ADC and the filter. Reducing the clock rate below the maximum value is disadvantageous with respect to noise density. Thermal and interference changes associated with the clock rate changes may also require system recalibration.

SUMMARY OF THE INVENTION

The present invention disclosed and claimed herein comprises a method and apparatus for varying the configuration of a FIR filter. A FIR filter engine is provided that has a predetermined length but is operable to have the length thereof varied. A memory is provided for storing a set of filter coefficients, the stored filter coefficients corresponding at least to the longest length processable by the FIR filter engine. Data is then received and input to the FIR filter engine and the FIR filter engine operated in one of two modes, a first mode and a second mode. In the first mode, the input data is processed through the FIR filter engine through the entire length thereof with all of the stored filter coefficients. This allows the FIR filter engine to realize a first filter function and output filtered data in accordance with the first filter function. In the second mode, the FIR filter engine is operable to process the input data therethrough with select ones of the filter coefficients and the FIR filter engine configured to provide a shorter processing length. This allows the FIR filter engine in the second mode to realize a second filter function different from the first filter function to output filtered data in accordance with the second filter function.

In another aspect of the present invention, the first and second filter functions are related and are substantially identical to each other. They are comprised of low-pass filter functions with the corner frequency of the first filter function being lower than the corner frequency of the second filter function. This allows the output filtered data in the first mode operating in accordance with the first filter function to be at a first word rate and the output filtered data processed in the second mode with the second filter function to be output at a second word rate that is higher than the first word rate.

In a further aspect of the present invention, the number of coefficients processed in the first mode is related to the number of coefficients processed in the second mode by an integral factor. This integral factor is two with the coefficients processed in the second mode being only the even filter coefficients or the odd coefficients, such that every other filter coefficient is not used.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
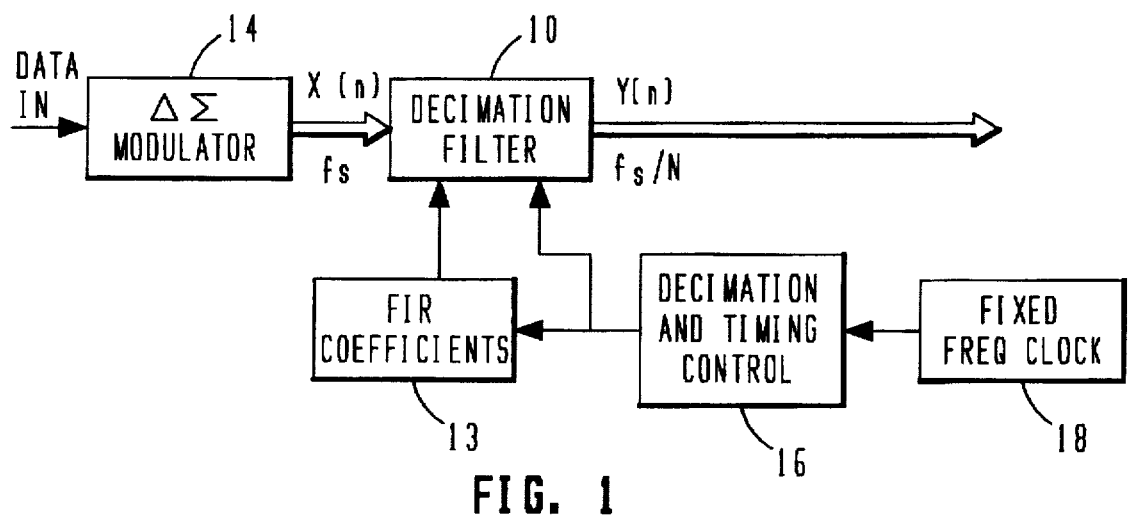
FIG. 1 illustrates an overall block diagram of the finite impulse response (FIR) filter utilizing the coefficient decimation operation of the present invention.

Referring now to FIG. 1, there is illustrated a block diagram of the digital filter of the present invention. The digital filter is generally represented by a block 10 that is labelled "FIR Decimation Filter". The FIR filter 10 is comprised of a decimation block that is operable to decimate the x[n] input sequence that operates at a sampling frequency of $f_s$. This results in the output y[n] sequence, which is a filtered output that is decimated by a factor N to a sampling rate of $f_s/N$. The FIR filter 10 operates on high precision FIR coefficients stored in a block 13, which coefficients are utilized to define the frequency response of the filter portion of the FIR filter 10 at the low frequency, as will be described hereinbelow.

The input to the FIR filter 10 operates at a sampling frequency $F_s$, which is generated by an analog modulator 11 that receives an analog input and then converts it into a digital stream of logic "1"s and logic "0"s. The output word rate y[n] operates at a word rate depending upon the coefficient decimation operation. In accordance with the present invention, depending upon the word rate, the method by which the filter operates is determined by a decimation timing control block 16 that is operable to determine how the filter 10 operates, this decimation and timing control block 16 operating in accordance with a fixed frequency clock 18.

Figure 2A:
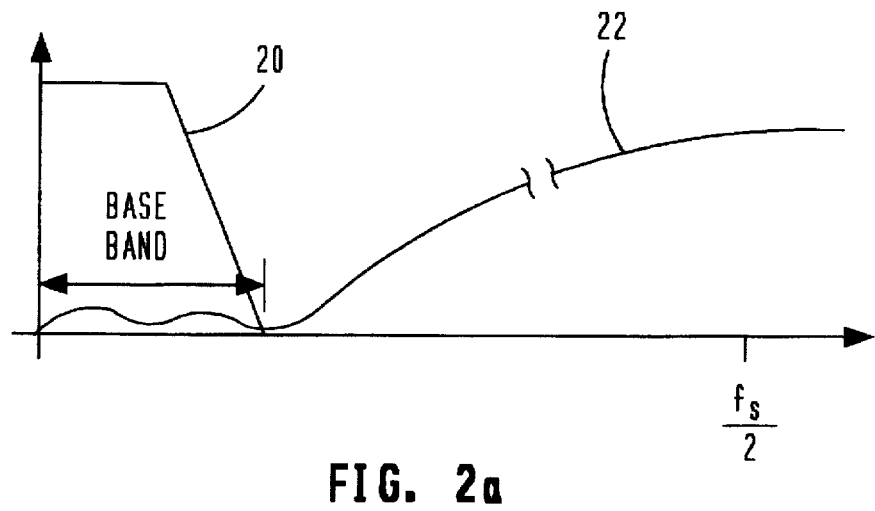
FIGS. 2a and 2b illustrate the frequency response for two different word rates.
Figure 2B:
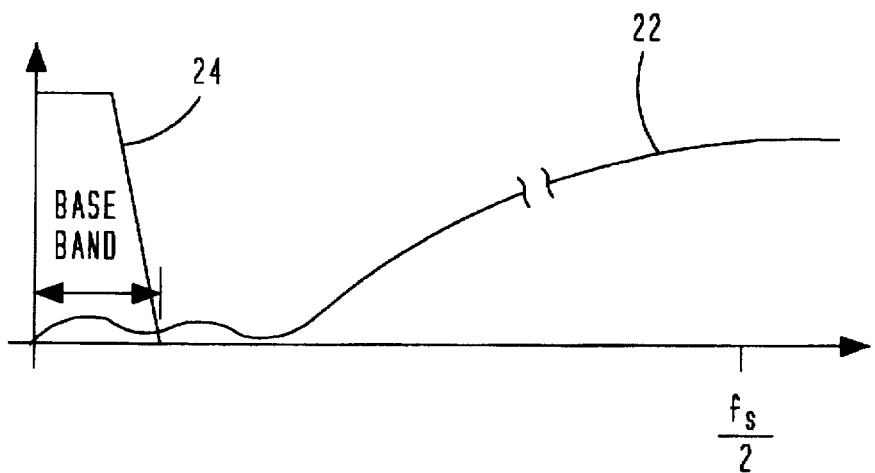

As will be described hereinbelow, there is a set of FIR coefficients for a given architecture that is selected based upon the desired frequency response of the filter at a given word rate and then the number of these coefficients reduced and the architecture reconfigured for another word rate, this operation is referred to as "decimation of coefficients". FIG. 2a illustrates the high word rate case and FIG. 2b illustrates the low word rate case. In FIG. 2a, there is illustrated a filter function 20 and the output spectrum of the delta-sigma modulator 14, referred to by reference numeral 22. The same frequency response 22 of the delta-sigma modulator 14 is illustrated in FIG. 2b, with a filter function 24 illustrating a lower passband.

In FIG. 2a, the word rate is, for example, 96 KHz. This results in a base band of 48 KHz. In the low word rate illustration of FIG. 2b, the word rate is, for example 48 KHz, one-half that of the word rate in FIG. 2a. The present invention achieves the two filter functions 20 and 24 with a single fixed clock. However, it is important to note that the delta-sigma modulator 14 is designed such that the passband thereof will operate correctly at both the high word rate and the low word rate, i.e., the quantization noise at the high word rate will be outside of the passband of the filter function 20. As such, this is the criteria that is utilized to design the delta-sigma modulator 14, this criteria then allowing the filter to operate at the second word rate. It is important to note that the sampling frequency $f_s$ is the same for both word rates—it is merely the filter function that is changed.

Figure 3B:
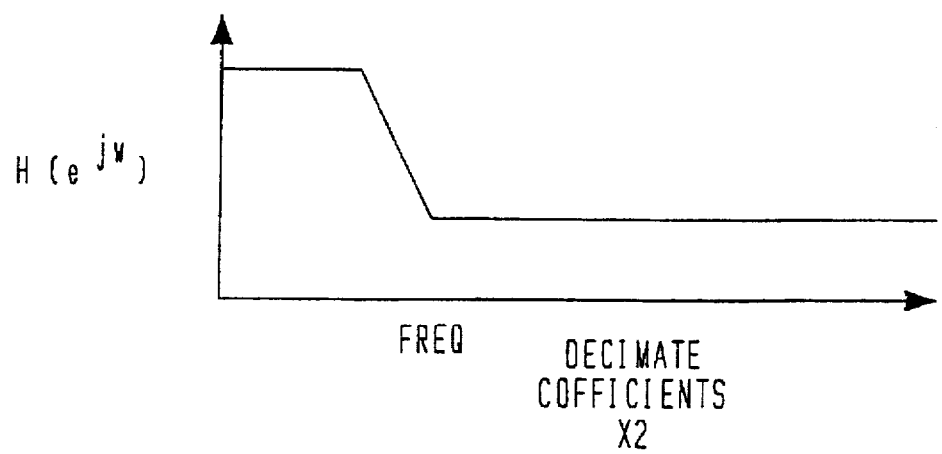
FIG. 3 illustrates the frequency response of the filter function as it is decimated by a factor of two.
Figure 3A:
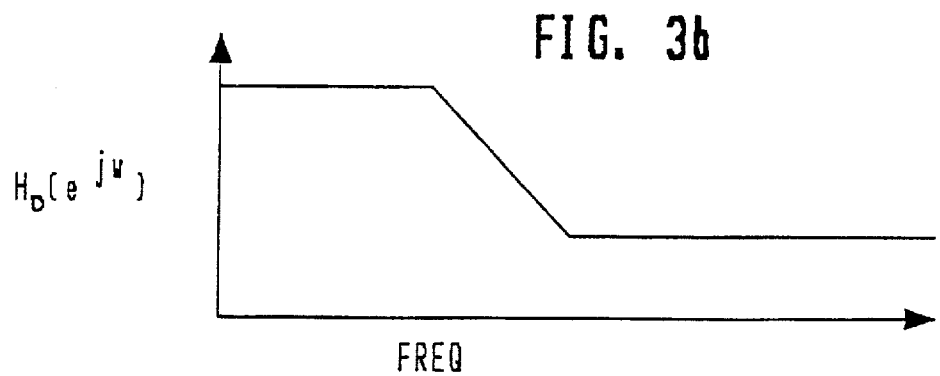

Referring now to FIG. 3, there is illustrated a plot of the filter function associated with the undecimated coefficients and the decimated coefficients. The undecimated coefficient filter is associated with the low word rate operation and has a frequency response $H(e^{j\omega T})$, where $T=1/f_s$. When the coefficients of the filter are decimated, this results in the filter function associated with the higher word rate and is referred to as $H_D(e^{j\omega T})$. It is interesting to note that when only the coefficients are decimated, this creates no aliasing problem, since both filter functions are low pass filters and, as such, they have anti-aliasing characteristics as an inherent part thereof.

Figure 4:
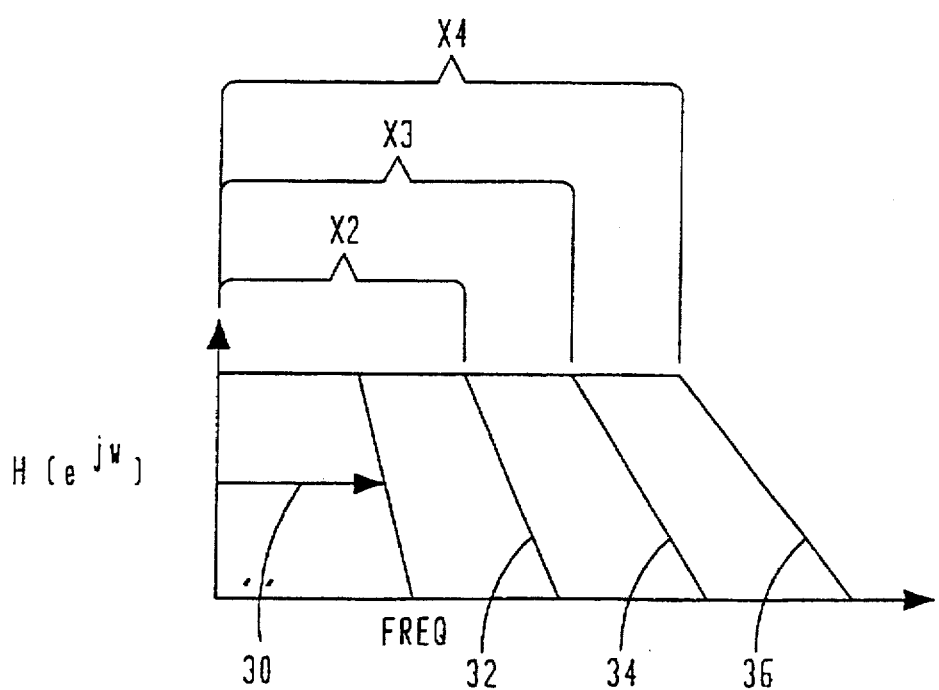
FIG. 4 illustrates a frequency plot of filter functions for multiple decimation ratios.

Referring now to FIG. 4, there is illustrated a frequency plot of these filter functions for different decimation ratios. The first filter function 30 comprises the undecimated filter coefficient function, i.e., utilizing all of the stored filter coefficients, whereas a second filter function 32 comprises an X2 decimation ratio for the filter coefficients, a third filter function 34 represents an X3 decimation coefficient ratio and a fourth filter function 36 represents an X4 decimation coefficient ratio. This decimation of coefficients will be defined hereinbelow.

Figure 5:
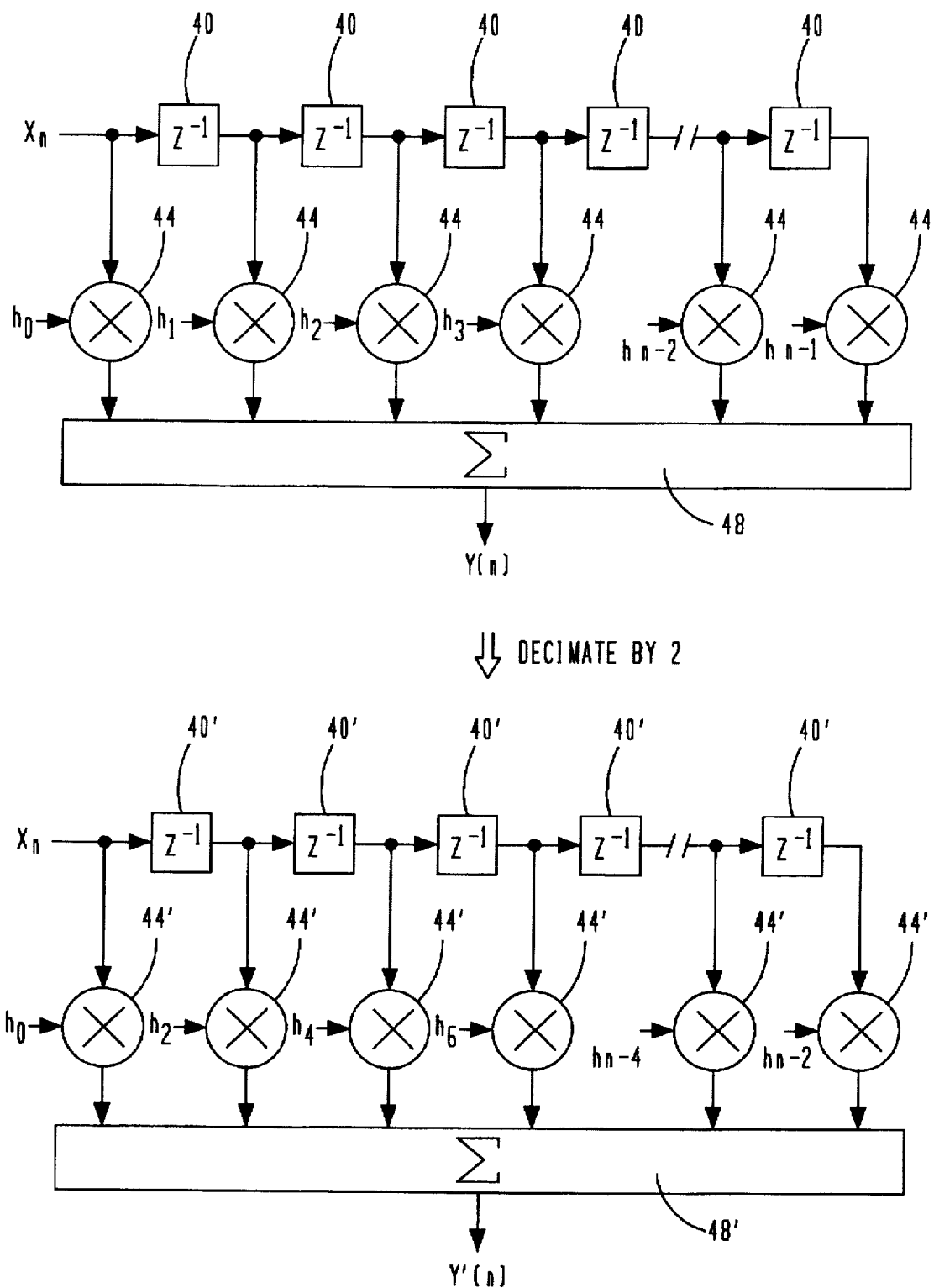
FIG. 5 illustrates a diagrammatic view of the decimation operation of a conventional filter architecture.

Referring now to FIG. 5, there is illustrated a diagrammatic view of the filter 10 before and after decimation of the coefficients. The filter is comprised of a plurality of delay blocks which are arranged in a serial manner. The input data from the analog modulator 14, x[n], is input to the first delay block 40, delayed by a delay $z^{-1}$ and then passed to the next delay block 40 and down to the end of the filter, the number of delay blocks 40 determined by the length of the filter. The input of the first delay block 40 and the output of the subsequent delay blocks 40 comprise "taps" of the filter. Each of the taps is input to an associated multiplier circuit 44, the other input thereof comprising an associated one of the filter coefficients, the first multiplier 44 associated with the first filter coefficient h0, the second multiplier 44 associated with the filter coefficient $h_1$ and the last multiplier 44 associated with the coefficient $h_{n-1}$. Therefore, there are n filter coefficients for an n-tap filter. The outputs of the multipliers 44 are input to an accumulator 48 to provide on the output the output y(n). In practical FIR filter implementations, the output samples are computed at the output word rate.

By way of example, the undecimated coefficient filter will be discussed with a length of 4096 taps. The filters output will be the convolution of the input sequence and the filters impulse response, i.e.:

$$y(n) = \sum_{i=0}^{4095} h(i)x(n-i) \quad (1)$$

The output sequence at a sampling frequency of 6.144 MHz will be down-sampled by 128x to give a decimated output at a sampling frequency of 48 KHz. If the output word rate is to be doubled, this would require that the filter have a decimation ratio of 64x. As will be described hereinbelow, this will require that the coefficients be decimated by a factor of two.

In order to perform the decimation of the coefficients by a factor of two, the technique of the present invention in the preferred embodiment is to utilize only the even coefficients such that every other coefficient is used with the odd coefficients discarded. This results in a filter length of 2048 taps. This is illustrated in FIG. 5, with the filter having delay blocks 40' corresponding to delay blocks 40 and multiplier blocks 44' corresponding to multiplier blocks 44. The output of multipliers 44' are input to an accumulator 48' corresponding to the accumulator 48. This results in the output of $y'_N$. The coefficients input to the multipliers 44' are the $h_0$ coefficient for the first multiplier 44', the $h_2$ coefficient (third coefficient) input to the second multiplier 44', the fifth coefficient $h_4$ input to the third multiplier 44', etc., with the 2048th coefficient $H_{n-2}$ input to the last multiplier 44'. This results in a 2048 tap filter wherein the coefficients $h_n$ are input with only even values for n. This results in the decimation by coefficient change which is illustrated in FIG. 3. This utilizes the same coefficient set for both the low word rate and high word rate operation wherein certain coefficients associated with the low word rate are deleted for use with the high word rate filter configuration. Therefore, it is necessary to design a 4096 tap filter for the low word rate operation and then utilize select ones of the same filter coefficients for the high word rate operation in a 2048 tap filter, it being noted that no coefficients are changed, i.e., the coefficients that are utilized in the high word rate operation are the same coefficients that are utilized in a low word rate operation. This therefore requires only a single ROM to be designed to hold at a maximum the larger number of coefficients associated with the low word rate operation. Additionally, it is important to note that the precision of the filter at the low word rate operation is higher than that at the high word rate. This is consistent with conventional design rules, in that a higher precision filter is required for lower word rate operation, i.e., a higher decimation ratio in the filter.

In order to illustrate how decimation of coefficients results in substantially the same filter function but at a higher passband frequency, consider that a filter that is operable in an undecimated coefficient 4096 tap configuration with associated filter coefficients h(n), and in a decimated coefficient filter configuration to decimate the coefficients by a factor of two to form a 2048 tap filter with filter coefficients $h_d(n)$. This will result in the following relationship:

$$h_d(n)=2h(2n) \quad (2)$$

The factor of "2" is to provide for two filters having the same DC gain.

This will result in the following frequency response:

$$H_D(e^{j\omega T}) = \sum_{n=0}^{2047} h_d(n)e^{-j\omega nT} \quad (3)$$

$$H_D(e^{j\omega T}) = \sum_{n=0}^{2047} 2h(2n)e^{-j\omega nT} \quad (4)$$

If we let the value of k=2n, then this will select the even coefficients, $h_0$, $h_2$, $h_4$, etc., resulting in the following equations:

$$H_D(e^{j\omega T}) = \sum_{k=0(\text{even})}^{4095} 2h(k)e^{-j\omega \frac{k}{2} T} \quad (5)$$

$$H_D(e^{j\omega T}) = \sum_{k=0(\text{all } k)}^{4095} 2h(k)\left[\frac{1+e^{-j\pi k}}{2}\right]e^{-j\omega \frac{k}{2}} \quad (6)$$

$$H_D(e^{j\omega T}) = \frac{2}{2}\sum_{k=0}^{4095} h(k)e^{-j\omega \frac{k}{2} T} + \frac{2}{2}\sum_{k=0}^{4095} h(k)e^{-j\omega \frac{k}{2} T} \cdot e^{-j\pi k} \quad (7)$$

$$H_D(e^{j\omega T}) = \sum_{k=0}^{4095} h(k)e^{-j\frac{\omega}{2} kT} + \sum_{k=0}^{4095} h(k)e^{j\frac{\omega}{2} kT} \cdot e^{-j\pi kT} \quad (8)$$

$$H_D(e^{j\omega T}) = H(e^{j\frac{\omega}{2} T}) + \Sigma H(e^{j\frac{\omega T}{2} + \pi)T}) \quad (9)$$

It can be seen that in Equation 6, the term "$e^{-j\pi k}$" is a term that will vary between "+1" or "−1". Therefore, for each odd value of k, this term will change the sign of the second half of the equation, resulting in a value of "0" for the equation. This will result in only 2048 terms, such that the value of the equation for each odd value of k will be 0, thus requiring only half of the coefficients, the even coefficients. Equation 8 illustrates the transform function, wherein the first half of the equation represents the frequency, a term that is expanded by a factor of two, and the second half of the equation represents a periodic replication. Thus, it can be seen that decimating the filter coefficients by a factor of two will increase the frequency of the filter by a factor of two. It is important to note that the coefficients used in the higher frequency filter structure, i.e., the structure with 2048 taps, utilizes the same coefficients that are utilized in the low frequency undecimated coefficient filter configuration, i.e., that utilizing 4096 taps. Therefore, once the set of coefficients is defined for the high precision low frequency filter, it is only necessary to discard the odd coefficients and utilize the remaining even coefficients to realize a lower precision high frequency filter. Of course, as described above, one could utilize the odd coefficients and throw out the even coefficients. This theory of operation can be utilized for frequencies that are expanded by a factor of three or by a factor of four, as long as they are an integer decimation ratio of the coefficients.

Figure 6:
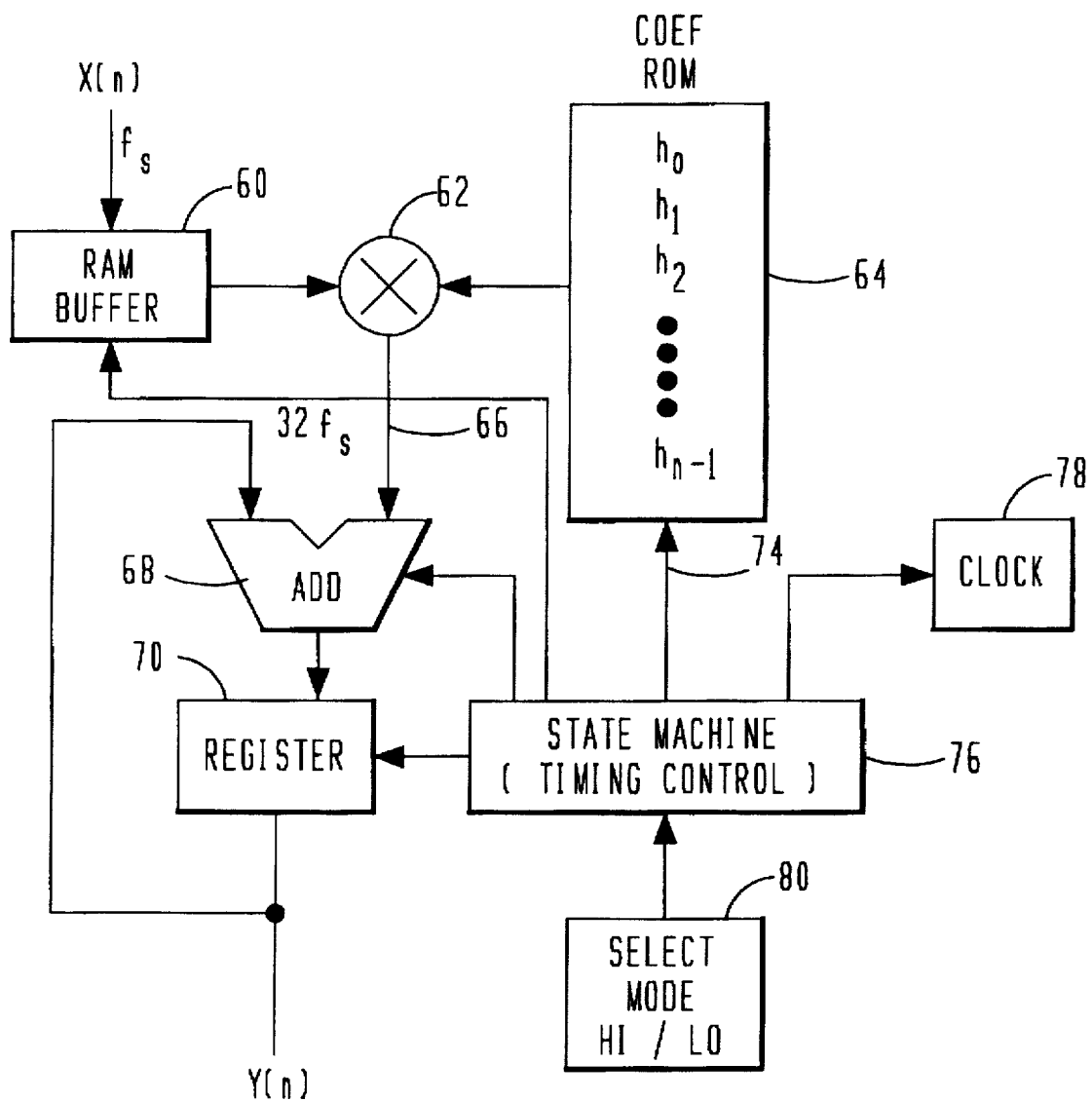
FIG. 6 illustrates a block diagram of the preferred embodiment of the present invention.

Referring now to FIG. 6, there is illustrated a block diagram of the preferred embodiment of the present invention. The data in the form of a digital stream of logic "1"s and "0"s are input to an elastic buffer 60 which comprises a dual port RAM although a FIFO could be utilized. The RAM 60 is operable to receive the input data on the input port at a rate of $f_s$, the sampling rate, this data for use in the filter algorithm. The output port of the RAM 60 is output at a rate of $32f_s$ for input to a multiplication circuit 62 which is a general combinatorial logic multiplication circuit represented as a single multiplier, although in practice multiple multiplication circuits are utilized in a parallel processing configuration in order to reduce the RAM 60 output rate. The other input to the multiplication circuit 62 is received from the output of a Read Only Memory (ROM) 64, which stores the filter coefficients and also outputs the stored filter coefficients at the same rate of RAM 60. Therefore, the multiplication circuit 62 is operable to multiply the input data output from the FIFO 60 by the appropriate coefficients from the ROM 64. This provides on an output 66 of the multiplication circuit 62 a product. This is input to an adder 68, which is also a combinatorial logic circuit. The adder 68 is operable to sum the product on the output 66 with the contents of a register 70. The sum of these two values is then stored in the register 70. The output of the register 70 after the entire operation comprises the output y[n]. The use of the multiplexed multiplication circuit 62 and the multiplexed adder 68 allows a single multiplier to be fabricated to perform the multiple operations that are necessary to realize the FIR filter. However, the multiplier and adder combination has a finite speed and, therefore, for high sampling rates it may be necessary to utilize multiple multiplication/addition circuits. It is only important to note that, when changing output frequencies, the number of multiplication operations that the multiplier 62 is required to process is changed for a given output, but the clock frequency is unchanged and the multiplication rate of the multiplier 62, the addressing rate of the RAM 60 and the addressing rate of the ROM 64 are also unchanged.

The coefficient ROM 64 is operable to store the coefficients h[0] through h[n−1]. The coefficient ROM 64 outputs the coefficients in response to an address received on an address input 74. This is generated by a state machine 76. The state machine 76 operates under a fixed clock 78 and determines the time at which the address on line 74 is generated for the coefficient ROM 74. As described above, for the low word rate output, a high precision filter is required and all the coefficients are output with n multiplication operations required to yield the low word rate output. For the higher word rate, a decimation ratio of two is utilized for the coefficients requiring only n/2 of the coefficients, either every odd one or every even one. Therefore, the low word rate requires n multiplications with utilization of all of the coefficients, whereas the higher word rate requires one half of the multiplication operations utilizing only one half of the coefficients. This is determined via a selection block 80.

In operation, the state machine 76 is operable to generate addresses on the line 74 for either the low word rate mode, i.e., the undecimated coefficient filter mode with all coefficients utilized in a multiplication operation, or the high word rate mode, i.e., the decimated coefficient filter mode, such that only every other coefficient is utilized in a multiplication operation. In the preferred embodiment, the addressing operation for both modes is at the same rate, $32f_s$. In addition the buffer 60 also operates at the same rate of $32f_s$ for both modes. The accumulation operation also operates at a rate of $32f_s$ for both modes, although the filter decimation ratio is different. For example, the low frequency mode has a decimation ratio or over sampling ratio of 128 with a 4096 tap filter configuration. This will require 4096 multiplications for each output but, since it is decimated by a factor of 128, these multiplications can be spread over $128f_s$, thus requiring an accumulation rate of $4096 \cdot f_s/128$, or $32f_s$. In the high frequency mode, the filter decimation ratio is 64 with a 2048 tap filter configuration. This will require 2048 multiplications for each output but, since it is decimated by a factor of 64, these multiplications can be spread over $64f_s$, thus requiring an accumulation rate of $2048 \cdot f_s/64$, or $32f_s$. This will result in the ROM 64 processing all stored coefficients for each word output at the low word rate. At the high word rate, only one half of the coefficients will be output for each word, but the word rate is twice that of the low word rate. Since there are two words output at the high word rate for each word output at the low word rate, the RAM 60 will be cycled through twice at the high word rate to output two words in the same time required to cycle through the ROM 64 for each word output at the low word rate. Since only every other coefficient is utilized at the high word rate, the rate to cycle through the ROM 64 twice at the high word rate is the same time required to cycle through the ROM 64 one time at the low word rate.

In summary, there has been disclosed a method and apparatus for realizing multiple filter responses with a single FIR filter architecture utilizing a single set of coefficients. This technique utilizes selection of the coefficients based upon the filter coefficients required. This is referred to as "decimation of coefficients". In the preferred embodiment, the filter is a low pass filter which is configured to have two corner frequencies. By selecting all of the coefficients associated with the FIR filter, this provides a low frequency filter with a relatively high precision. By selecting every other coefficient, this results in a filter of one-half the length of the high precision filter, with a corner frequency that is increased by a factor of two.

Although the preferred embodiment has been described in detail, it should be understood that various changes, substitutions and alterations can be made therein without departing from the spirit and scope of the invention as defined by the appended claims.

What is claimed is:

1. A method for varying the configuration of a finite impulse response (FIR) filter, comprising the steps of:
   providing a FIR filter engine of a predetermined length;
   storing a plurality of FIR filter coefficients for use with the FIR filter engine in a coefficient memory;
   receiving an input digital data stream;
   operating in a first mode and processing the input stream of data through the entire length of the FIR filter engine with all of the stored coefficients to realize a first filter function in a first and selectable mode to output filtered data; and
   alternately operating in a second mode and processing the input data through the FIR filter engine with only select ones of the filter coefficients, the number being less than all of the filter coefficients and processed through the FIR filter engine over less than the entire length thereof in order to realize a second filter function in a second and selectable mode to output filtered data.

2. The method of claim 1, wherein the first filter function is related to the second filter function.

3. The method of claim 2, wherein the first filter function is substantially identical to the second filter function but translated down in frequency.

4. The method of claim 2, wherein the first and second filter functions are low pass filter functions with the first filter function having a lower corner frequency than the second filter function.

5. The method of claim 4, wherein the filtered data output in the first mode is at a first word rate and the filtered data output in the second mode is at a second word rate that is higher than the first word rate.

6. The method of claim 1, wherein the step of processing in the first mode and the step of processing in the second mode both process at a constant rate.

7. The method of claim 1, wherein the number of filter coefficients processed in the first mode is related to the number of coefficients processed in the second mode by an integral factor.

8. The method of claim 7, wherein the integral factor is two.

9. The method of claim 8, wherein the filter coefficients processed in the second mode are either the even filter coefficients or the odd filter coefficients such that every other coefficient is utilized in the step of processing.

10. The method of claim 1, wherein the step of processing in either the first mode or the second mode comprises:
    operating the FIR filter engine such that a multi-tap configuration is realized;
    delaying the data in the received input data stream along the length of the FIR filter to provide a multi-tap configuration with each bit of data in the input stream of data delayed from the previous bit of data in the received input data stream such that each delayed bit of data is associated with one of the taps in the multi-tap configuration;
    multiplying each of the delayed bits of data at each of the taps with an associate done of the stored coefficients to provide a product; and
    summing all of the products from the step of multiplying in an accumulation operation to provide an output and selecting one out of M of the outputs as the filter output, M being a filter decimation ratio.

11. The method of claim 10, wherein:
    the step of delaying comprises storing the data in the input data stream in a buffer device and outputting the stored input data for each multiplication operation;
    the step of multiplying comprising:
    providing a multiplexed multiplier, and
    operating the multiplier to multiply the stored input data for each of the taps of the multi-tap configuration by the associated stored coefficients during at least the time required to store the input data associated with one of the M-decimated outputs.

12. The method of claim 11 wherein the step of operating the multiplier for both the first and second modes is at substantially the same rate.

13. The method of claim 12 wherein the step of outputting the stored input data for use in the step of multiplying for both the first and second modes occurs at substantially the same rate.

14. A method for convening an analog signal to a digital signal at multiple output word rates comprising the steps of:
    converting the analog signal to a digital serial signal with an analog modulator and operating the analog modulator at a fixed sampling frequency;
    providing a digital filter engine to process the digital serial signal;
    storing a plurality of filter coefficients for use with the digital filter engine in a coefficient memory;
    operating the digital filter engine in a first mode to output digital data at a first word rate; and
    operating the digital filter in a second mode to output digital data a second word rate.

15. The method of claim 14, wherein the step of converting the data comprises converting the data from an analog signal to a digital signal with a delta-sigma analog modulator.

16. The method of claim 14, wherein the step of providing a digital filter comprises providing a FIR digital filter engine.

17. A method for converting an analog signal to a digital signal with a variable bandwidth, comprising the steps of:

converting the analog signal to a digital signal with an analog modulator and operating the analog modulator at a fixed sampling frequency;

providing a digital filter engine;

storing a plurality of filter coefficients for use with the digital filter engine in a coefficient memory;

operating the digital filter engine in a first mode at first bandwidth and utilizing a portion of the filter coefficients stored in the coefficient memory; and operating the digital filter engine in a second mode at a second bandwidth utilizing a subset of the portion of filter coefficients, which subset comprises less filter coefficients than the filter coefficients that comprise the portion.

18. The method of claim 17, wherein the step of converting the data comprises converting the data from an analog signal to a digital signal with a delta-sigma analog modulator.

19. The method of claim 17, wherein the step of providing a digital filter comprises providing a FIR digital filter engine.

20. A digital decimation filter for use with an analog-to-digital data conversion device, comprising:

a finite impulse response (FIR) filter engine of a predetermined length;

a coefficient memory for storing a plurality of FIR filter coefficients for use with said FIR filter engine;

an input for receiving an input digital data stream;

a configuration device for operating said FIR filter engine in a first mode and processing said input stream of data through the entire length of said FIR filter engine with all of the stored coefficients stored in said memory to realize a first filter function in a first and selectable mode to output filtered data; and said configuration device alternately operating in a second mode and processing said input data through said FIR filter engine with only select ones of said filter coefficients stored in said memory, the number being less than all of said filter coefficients and processed through said FIR filter engine over less than the entire length thereof in order to realize a second filter function in a second and selectable mode to output filtered data.

21. The digital decimation filter of claim 20, wherein said first filter function is related to said second filter function.

22. The digital decimation filter of claim 21 wherein said first filter function is substantially identical to said second filter function but translated down in frequency.

23. The digital decimation filter of claim 21, wherein said first and second filter functions are low pass filter functions with said first filter function having a lower corner frequency than said second filter function.

24. The digital decimation filter of claim 23, wherein said filtered data output in said first mode is at a first word rate and said filtered data output in said second mode is at a second word rate that is higher than said first word rate.

25. The digital decimation filter of claim 20, wherein said configuration device is operable to process said input data in said first mode and in said second mode at a constant rate.

26. The digital decimation filter of claim 20, wherein the number of said filter coefficients processed by said FIR filter engine in said first mode is related to the number of said filter coefficients processed in said second mode by an integral factor.

27. The digital decimation filter of claim 26, wherein said integral factor is two.

28. The digital decimation filter of claim 27, wherein said filter coefficients processed by said FIR filter engine in said second mode are either said even filter coefficients or said odd filter coefficients such that every other coefficient is utilized in the processing.

29. The digital decimation filter of claim 20, wherein said FIR filter engine comprises:

a delay device for delaying said data in said received input data stream along the length of said FIR filter engine to provide a multi-tap configuration with each bit of data in said input stream of data delayed from the previous bit of data in the received input data stream such that each delayed bit of data is associated with one of said taps in said multi-tap configuration;

a multiplication device for multiplying each of said delayed bits of data at each of said taps with an associate done of said stored coefficients to provide a product; and an accumulation device for summing all of said products from the output of said multiplication device in an accumulation operation to provide an output and selecting one out of M of said outputs as the filter output, M being a filter decimation ratio.

30. The digital decimation filter of claim 29, wherein:

said delay device comprises a buffer for storing said data in said input data stream and outputting said stored input data for each multiplication operation performed by said multiplication device;

said multiplication device comprising a multiplexed multiplier, and said configuration device operating said multiplier to multiply said stored input data for each of said taps of said multi-tap configuration by said associated stored coefficients during at least the time required to store said input data associated with one of said M-decimated outputs.

31. The digital decimation filter of claim 30 wherein said configuration device operates said multiplier for both said first and second modes at substantially the same rate.

32. The digital decimation filter of claim 31 wherein said configuration device operates said buffer to output said stored input data for use in the operation of said multiplier for both said first and second modes at substantially the same rate.

33. An analog-to-digital converter operating to output digital data at multiple word rates, comprising:

an analog modulator for receiving an analog input signal and outputting a digital signal and operating at a fixed sampling frequency;

a digital filter engine;

a coefficient memory for storing a plurality of filter coefficients for use with said digital filter engine; and a configuration device for configuring said digital filter engine to operate in a first mode to output digital data at a first word rate and in a second mode to output digital data at a second word rate.

34. The analog-to-digital converter of claim 33, wherein said analog modulator comprises a delta-sigma modulator.

35. The analog-to-digital converter of claim 33, wherein said digital filter engine comprises a FIR digital filter engine.

36. An analog-to-digital converter for operating with a variable bandwidth, comprising:

an analog modulator for receiving an analog input signal and outputting a digital signal and operating at a sampling frequency;

a digital filter engine;

a coefficient memory for storing a plurality of filter coefficients for use with said digital filter engine; and a configuration device for configuring said digital filter engine to operate in a first mode with a first bandwidth utilizing a portion of said filter coefficients stored in said coefficient memory and in a second mode with a second bandwidth utilizing a subset of said portion of filter coefficients, which subset has less coefficients than the number of coefficients comprising said portion.

37. The analog-to-digital converter of claim 36, wherein said analog modulator comprises a delta-sigma modulator.

38. The analog-to-digital converter of claim 37, wherein said digital filter engine comprises a FIR digital filter engine.

* * * * *